United States Patent [19]

Liu et al.

[11] Patent Number: 5,116,693
[45] Date of Patent: May 26, 1992

[54] UNIQUE SYSTEM OF FE/PD FOR MAGNETO-OPTICAL RECORDING AND MAGNETIC SWITCHING DEVICES

[75] Inventors: Chian Q. Liu, Hinsdale; Samuel D. Bader, Oak Park, both of Ill.

[73] Assignee: The United States of America as represented by the United States Department of Energy, Washington, D.C.

[21] Appl. No.: 526,915

[22] Filed: May 22, 1990

[51] Int. Cl.$^5$ .................................................. G11B 5/70
[52] U.S. Cl. .................................. 428/694; 428/676; 428/900; 427/128; 427/295; 369/13
[58] Field of Search ............... 428/670, 694, 900, 676; 427/128, 295

[56] References Cited

PUBLICATIONS

Elmers et al. "Magnetometry of the Ferromagnetic Monolayer Fe(110) on W(110) coated with Ag," Phys. Rev. Lett., vol. 63 (Jul. 31, 1989) pp. 566–569.
Tian, D. et al. "Epitoxy of Mn on Pd (001)," Solid State Comm., vol. 70 pp. 199–204 (1989).
Binns et al. "Magnetic Behavior of Ultra-Thin Iron Overlayers on Palladium (111)"; Solid State Comm. vol. 43 (1982) pp. 853–855.
Koon, N. C. et al. "Direct Evidence for Perpendicular Spin Orientations and Enhanced Hyperfine Fields in Ultrathin Fe(100) Films on Ag(100)", Physical Rev. Lett vol. 59 (1987) pp. 2463–2466.
Dutcher et al. "Magnetic properties of sandwiches and superlattices of fcc Fe (001) grown on Co (001) substrates", J. Appl. Phys. vol. 63 (Apr. 15, 1988), pp. 3464–3466.
van Acker et al., "Electronic structure of Fe, Co, and N. Impurities in Pd," Physical Review B, vol. 38 (Nov. 15, 1988), pp. 10463–10467.
Magneto-Otical Studies of Metastable 3d–Transition Metal Films, C. Liu and S. D. Bader, Physics B 161 (1989) pp. 253–259.
Two-Dimensional Magnetic Phase Transition of Ultra-thin Iron Films on PD(100), C. Liu and S. D. Bader, Journal of Applied Physics 67 (9), May 1, 1990 pp. 5758–5760.
Perpendicular Surface Magnetic Anisotropy in Ultrathin Epitaxial FE Films, C. Liu and S. D. Bader, Journal of Vacuum Science and Technology, May/Jun. 1990, pp. 2727–2731.
Surface Magneto-Optical Studies of Ultrathin Ferromagnetic Films, C. Liu and S. D. Bader Second International Workshop on the Magnetic Properties of Low-Dimensional Systems, May 26–26 1989.
Magnetic Properties of Novel Epitaxial Films, S. D. Bader et al., J. App. Phys. 61 (8), Apr. 15, 1987.
Magnetism of Epitaxial fcc Iron Films on Cu(001) Investigated by Spin-Polarized Photoelectric Emission, D. Pescia et al.
Phy. Rev. Lett. 58, 2126, May 18, 1987.
Polar Kerr-Effect Observation of Perpendicular Surface Anisotropy for Ultra-Thin fcc Fe Grown on Cu(100), C. Liu et al.
Phys. Rev. Lett 60, 2422, Jun. 6, 1988.

*Primary Examiner*—Herrell C. Cashion, Jr.
*Assistant Examiner*—Robert J. Follett
*Attorney, Agent, or Firm*—Bradley W. Smith; John M. Albrecht; William R. Moser

[57] ABSTRACT

A high density magneto-optical information storage medium utilizing the properties of an ultrathin iron film on a palladium substrate. The present invention comprises a magneto-optical medium capable of thermal and magnetic stability and capable of possessing a vertical orientation of the magnetization vector for the magnetic material. Data storage relies on the temperature dependence of the coercivity of the ultrathin film. Data retrieval derives from the Kerr effect which describes the direction of rotation of a plane of polarized light traversing the ultrathin magnetic material as a function of the orientation of the magnetization vector.

10 Claims, 3 Drawing Sheets

ULTRATHIN FILM FE ON PD

UNIQUE SYSTEM OF FE/PD FOR MAGNETO-OPTICAL RECORDING AND MAGNETIC SWITCHING DEVICES

CONTRACTUAL ORIGIN OF THE INVENTION

The U.S. Government has rights in this invention pursuant to Contract No. W-30-109-ENG-38 between the U.S. Department of Energy and the University of Chicago, operator of Argonne National Laboratory.

BACKGROUND OF THE INVENTION

In magneto-optics, a thin film of magnetic material is used to read, record, and delete data. The magnetic material accomplishes this by orienting the magnetization vectors within the material in one of two directions such as either an up or down. Depending on the selected direction, a label of either 1 or 0 is given to the respective magnetization vector. A sequence of these purposefully oriented vectors or bits is coded for specific digital information storage. To change or erase the data, the direction of one or more of the bits must be flipped. The magnetic force required to flip the magnetization from one configuration to the other, the coercive force, is temperature dependent and for a magneto-optical information storage system decreases with increasing temperature. To accomplish the read-write functions of the magneto-optical material an external bias magnetic field of magnitude less than the coercive force, at the system's ambient operating temperature, is applied; however, since the applied magnetic force is less than the coercive force no reorientation of the magnetization occurs. If, however, the temperature of this segment of the magnetic material is raised high enough the coercive force requirement decreases to the point where the bias field is now capable of flipping the orientation of the bit so as to align itself with the bias field vector. Since the objective of the magneto-optical system is to process large amounts of data rapidly, it is crucial that the system possess thermal stability and reversibility with respect to the coercive force value and the structural integrity as the area of interest cycles through the set temperature range required to flip the material's magnetization.

The characteristics of the thin magnetic film lend themselves for use as a recording medium for a laser based recording-retrieval system. For use with this system, a thin film of a magneto-optical medium coats a polycarbonate disk. The disk is then rotated and a small section, where information is to be entered, is subjected to an external bias field. If information is to be added or changed, this small section of the disk is subjected to illumination by a laser beam. The laser beam heats the section of the disk to a sufficient temperature to allow the magnetization of the thin film to align itself with the bias field. This permits the magneto-optical disk to record information in a manner similar to a magnetic tape.

The magneto-optical disk is read using a lower power setting for the laser and employing the Kerr effect. Under the Kerr effect, the plane of polarization of the laser as it interacts with the magnetized region of the thin film is rotated either clockwise or counterclockwise depending on the orientation of the magnetization in the thin film. This rotation permits the use of a polarizer to transform the rotation into a varying intensity, and thus, one can determine the binary value, 0 or 1, by measuring the difference in intensity of the reflected beam. Since the magnitude of the rotation is only of the order of 0.25 degree, the signal to noise ratio becomes an important factor in reading magneto-optic data and is a limiting factor in the magneto-optical material used on the disk. Signal to noise ratios for magneto-optical materials currently in use are in the 45 to 60 db range. *Optical Disks Become Erasable*, Robert Freese, IEEE Spectrum, Feb. 1988, p 43.

The magneto-optic information storage technology provides a more stable and a more densely packed medium than a magnetic recording medium. Due to the high coercive force at room temperature, it is very difficult to inadvertently erase data from the magneto-optical disk as compared to the magnetic disk which can experience data loss from the magnetic field associated with 600 volt power source. The most advanced Winchester disks have a magnetic recording density of 43 megabits per square inch while the current magneto-optical disk has a density of 300 megabits per square inch. *Optical Disks Become Erasable*, Robert Freese, IEEE Spectrum, Feb. 1988, pp 41-45.

In developing a magneto-optical medium for use with optical disks, several factors are important for optimal storage of information. To optimize data storage in the smallest physical space, the magnetization associated with the magneto-optical material should be oriented perpendicular to the plane of the medium. This is referred to as a perpendicular or vertical medium as opposed to a longitudinal medium which has its magnetic orientation in the plane of the medium. Perpendicular media have the energetic advantage of lower demagnetizing forces on opposing bits than longitudinal media. As was mentioned previously, temperature stability and signal to noise ratio also play critical roles.

The ultrathin regime refers to the thickness range that is shorter than the penetration depth of the light source. The ultrathin regime is distinctly different than the thick-film regime and possesses unique magneto-optical properties. The ultrathin regime exhibits characteristics of the Faraday effect because the light transmitted through the magnetic film reflects from the surface of the metallic substrate and travels back through the magnetic film a second time. The larger the reflectivity mismatch at the solid-solid interface, the larger the response from the Faraday signal. There are also ways of enhancing the Kerr rotation which involve the reflectivity minima associated with the rotation maxima. However, since the signal-to-noise ratio of a device will depend on the total signal strength, it is not optimal to enhance the rotation at the expense of the reflectivity.

The technique of ultrahigh vacuum and molecular beam epitaxy can be used to fabricate the ultrathin film on the substrate. Such films are grown by epitaxial deposition of magnetic material onto selected non-magnetic single crystal substrates. To achieve the thicknesses of interest, iron films are grown epitaxially layer-by-layer and take on the substrate inplane lattice spacing.

Ultrathin magnetic films offer the possibility of stabilizing the desired perpendicular orientations of the magnetization. It is known that surfaces and interfaces of ultrathin magnetic films possess physical properties that can dramatically differ from those of similar bulk materials. Reduced coordination and the disruption of the translational symmetry of the material alter their electronic, vibrational, and magnetic properties. A subtle manifestation of these changes in environment is that the spin-orbit coupling that governs magnetic anisotropy can energetically favor perpendicular spin orientations in the surface region of materials whose bulk symmetry is cubic. As the magnetic-layer thickness increases, the demagnetizing-field term overwhelms the surface contribution and the film reverts to a longitudinal magnetization. This suggests that as the thickness of an ultrathin medium is increased there is a region where the magnetization vector changes orientation from perpendicular to longitudinal based on thickness alone.

Accordingly, it is an object of this invention to provide a nonvolatile, high density, high signal to noise ratio, erasable medium for data storage using a ultrathin film of magnetic material epitaxially deposited on a non-magnetic substrate.

It is still a further object of this invention to provide a magnetic storage medium that utilizes the properties of an ultrathin film to maintain a vertical magnetization of the medium.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

SUMMARY OF THE INVENTION

To achieve the foregoing and other objectives and in accordance with the purposes of the present invention, as embodied and broadly described herein, the present invention provides for high density information storage medium utilizing the properties of an ultrathin film. Fabrication of such films occur through the epitaxial deposition of magnetic material on nonmagnetic substrates. The ultrathin magnetic film has a vertical magnetization and is capable of storing, retrieving, and erasing data. Storage and erasure of the data associated with the ultrathin film utilizes the temperature dependent magnetic coercivity of the ultrathin medium and the effect of a biased magnetic field on the magnetic vectors associated with the magnetic material. The retrieval of data from the ultrathin film is based on the Kerr effect on a beam of polarized light and the subsequent change of intensity of the light in a specific plane after interaction with the magnetic vector.

DETAILED DESCRIPTION OF THE INVENTION

The present invention provides a high density magneto-optical information storage medium employing an ultrathin iron film on a palladium substrate.

Figure 1:
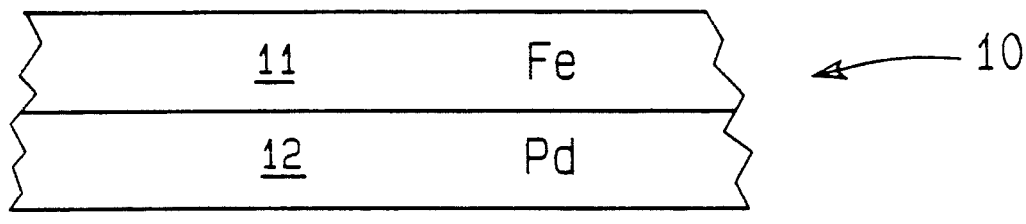
FIG. 1 is a depiction of a cross section of the magneto-optical informational storage medium in the present invention.

FIG. 1 depicts a cross sectional representation of the magneto-optical information storage medium 10 of the present invention. The medium 10 includes a ultrathin film of a ferromagnetic (Fe) material 11 on a nonmagnetic palladium substrate 12. This structure is fabricated by epitaxial deposition of the ferromagnetic material onto the nonmagnetic palladium (Pd) via molecular beam epitaxy in an ultra high vacuum environment measuring in the range of $10^{-11}$ Torr. The Pd substrate was mechanically polished to a 1-um diamond-paste finish, installed with its [110] direction aligned (horizontally) in the plane of incidence. Repeated Ar+ sputter and 650 C anneal cycles were applied until sharp $p(1 \times 1)$ low energy electron diffraction (LEED) patterns were observed. Epitaxial evaporation was obtained according to LEED observations and Auger intensity versus deposition-time measurements. LEED patterns for Fe/Pd(100) films follow that of the substrate for the thickest films, approximately 9 monolayers (ML).

Figure 2A:
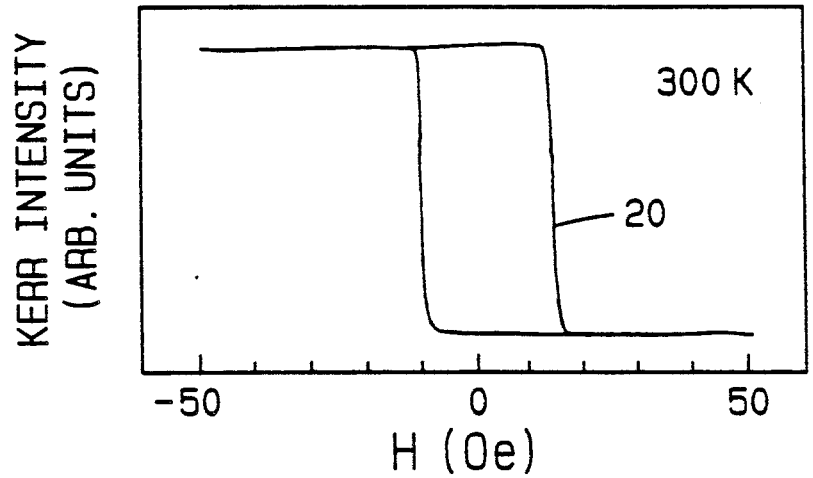
FIG. 2 is a graph of the temperature dependent coercive field for a 1.2 monolayer Fe/Pd (100) film.
Figure 2B:
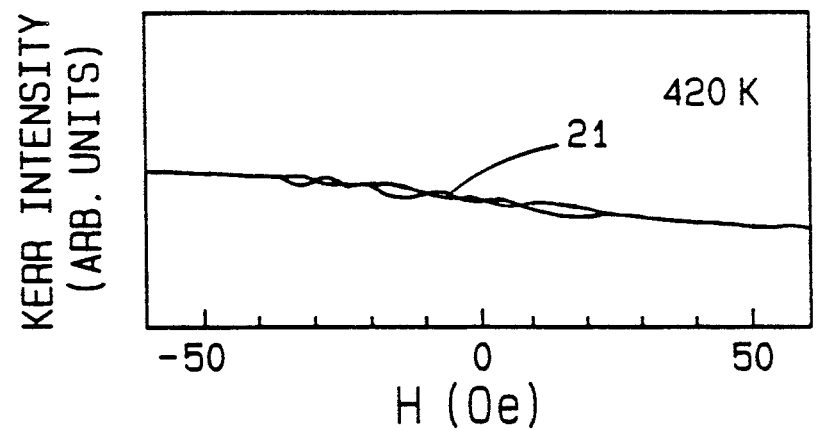
Figure 2C:
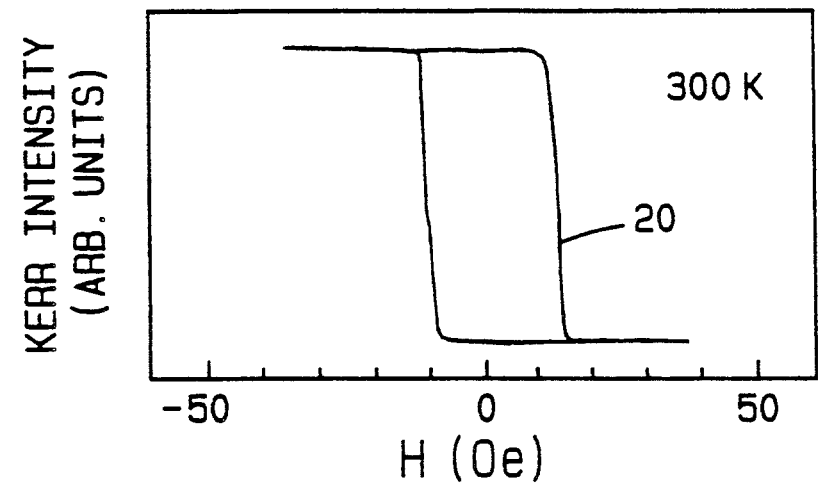

Magnetic properties are detected in situ using the surface magneto-optical Kerr effect (SMOKE) since the Kerr effect provides a direct observation of the perpendicular surface anisotropy of an ultrathin Fe film. SMOKE monitors the in-plane and perpendicular magnetization components, via sequential longitudinal and polar Kerr measurements, respectively. Sweeping the magnetic field and detecting the change in intensity of reflected light determine the magnetic hysteresis curves, FIG. 2. The intensity component is referred to as the Kerr intensity, and it is proportional to the Kerr rotation and to the sample magnetization. The squareness of the loops 20 at lower temperatures indicates switching with the remanent-state magnetization I (H=0) having the same value as at high fields, I $H_{max}$. The square loops 20 show that the easy axis of magnetization is perpendicular to the film plane. Magnetically cycling the Fe/Pd film at a temperature of 420 K (21) results in no residual magnetization indicating that the material has eclipsed the transition temperature. When the temperature was returned to 300 K (20) the same hysteresis loop shape was obtained as was observed at 300 K prior to eclipsing the transition temperature. This property indicates a hysteresis stability with respect to cycling the film above its transitional temperature and returning it to its original temperature.

Figure 3A:
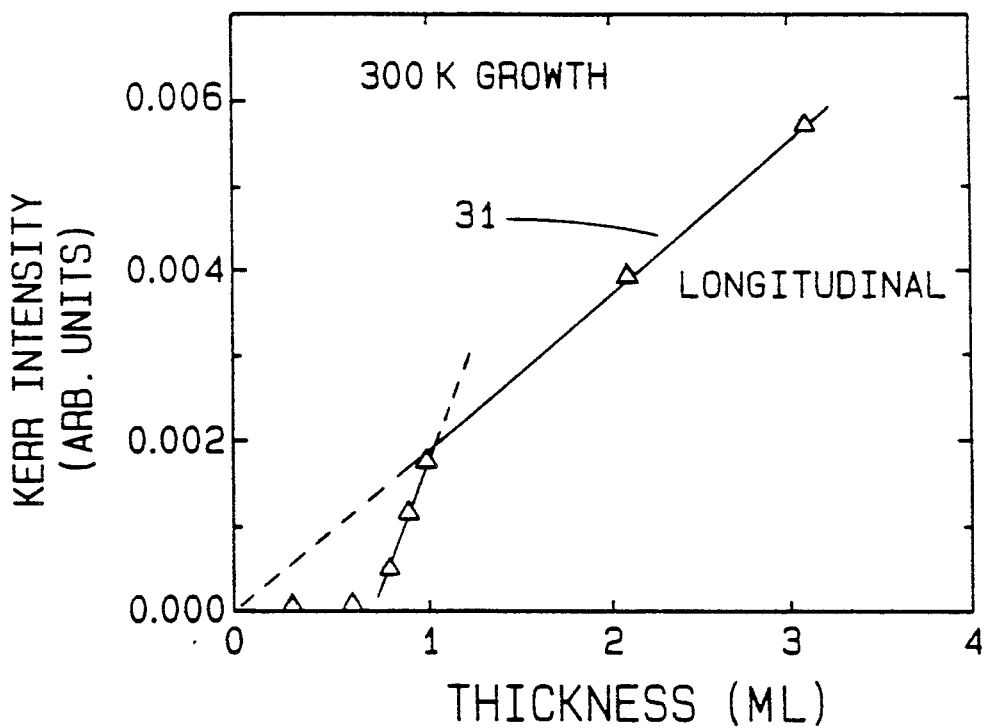
FIG. 3 is a graph of the change in magnetic field orientation with respect to growth temperature and ultrathin film thickness.
Figure 3B:
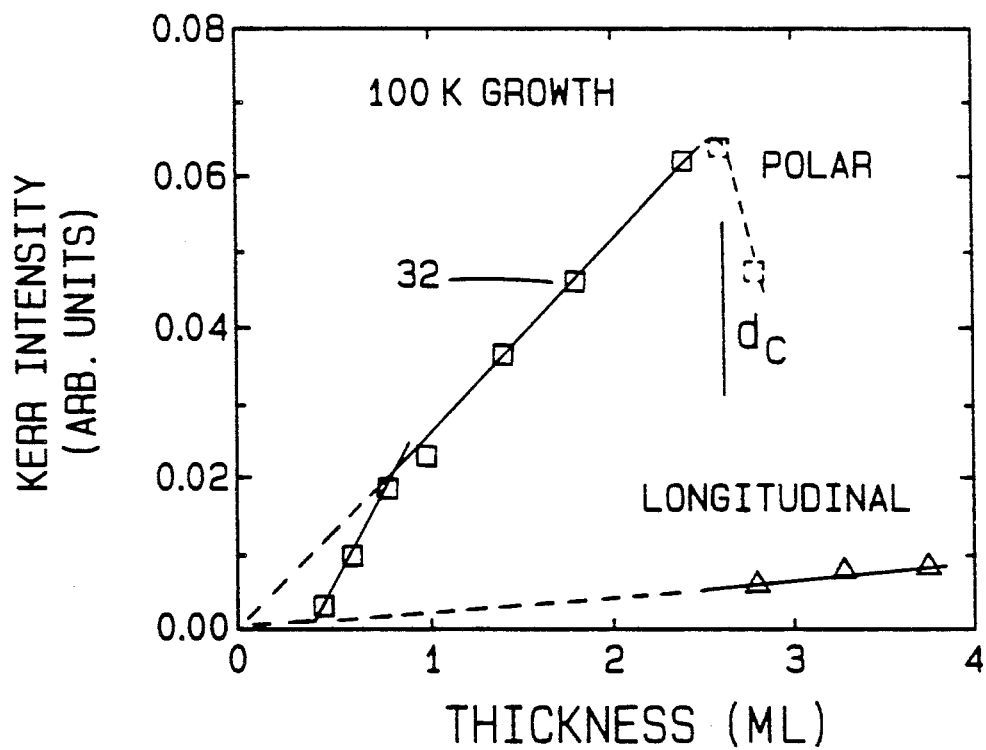

The easy axis of magnetization depends on the growth temperature of the ultrathin Fe film, FIG. 3. Films grown at approximately 300 K (31) have in-plane easy axes, where only longitudinal Kerr effect hysteresis are present. Films grown at 100 K (32) have vertical easy axes for film thicknesses less than 2.5 ML. Films grown at 300 K retain their in-plane easy axis when cooled to 100 K, and those less than 2 ML grown at 100 K do not change their vertical easy axis up to the Curie temperature ($T_c$). The growth temperature boundary between the two magnetization orientations is approximately 270 K, and depends to a degree on substrate quality.

Figure 4A:
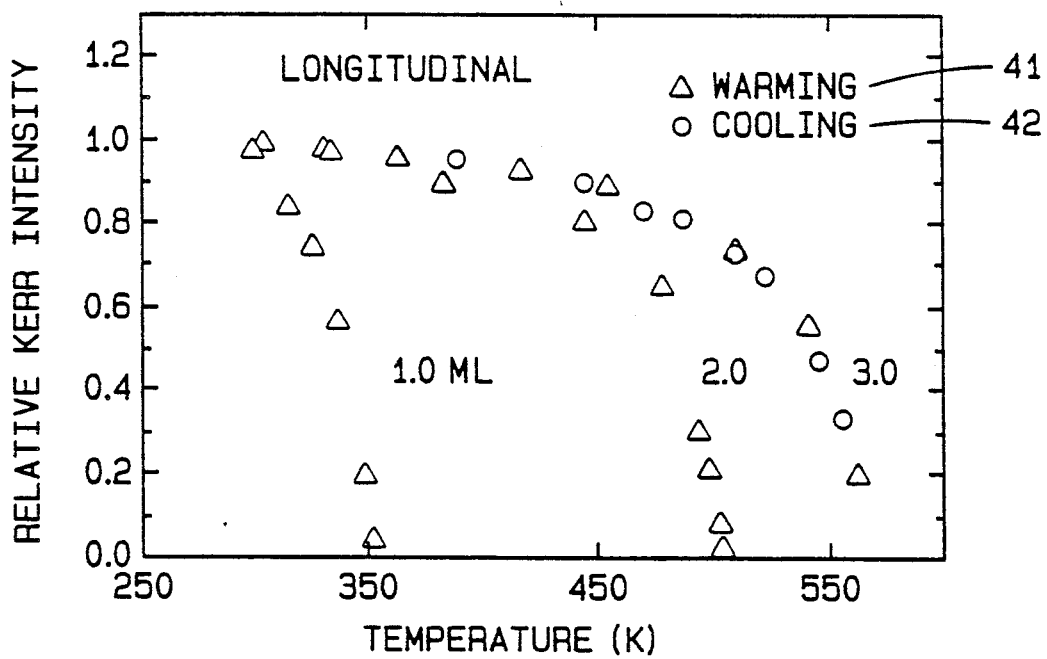
FIG. 4 is a graph of the change in the relative Kerr intensity for Fe/Pd (100) with changes in temperature at various film thicknesses.
Figure 4B:
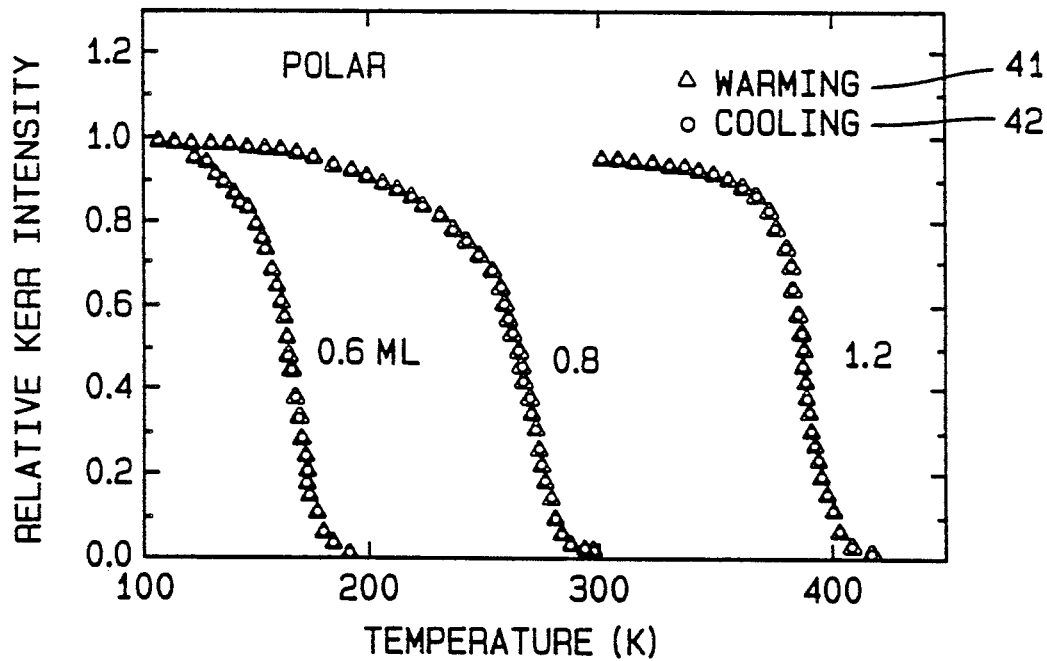

The temperature dependence of the normalized Kerr intensities is shown in FIG. 4. FIG. 4(a) is for films grown at 300 K with in-plane easy axes, so only the longitudinal SMOKE signals show hysteresis. The data corresponds to the measured hysteresis loops. FIG. 4(b) is for films grown at 100 K with vertical easy axes, as measured in the polar SMOKE configuration. All films undergo second-order magnetic phase transitions with thickness dependent $T_c$ values. The transitions are thermally reversible as is shown by the overlap of the warming and cooling curve data sets 41,42.

Thus, by controlling the growth conditions, the direction of the easy axis of magnetization can be manipulated. This magneto-optical medium also exhibits a signal to noise ratio of greater than 100db.

The embodiments of the invention in which an exclusive property or privilege is claimed are defined as follows:

1. A magneto-optical information storage medium comprising:
   a palladium substrate;
   an ultrathin iron film epitaxially deposited on said palladium substrate where said ultrathin iron film has a thickness of less than 2.5 monolayers and has an easy axis of magnetization oriented perpendicular to the plane of said ultrathin iron film.

2. The method of employing a ultrahigh vacuum, molecular beam epitaxy deposition technique to produce a ultrathin iron film on a palladium substrate where the thickness of said ultrathin iron film is determined by a layer on layer depositional growth using said epitaxial technique.

3. The medium of claim 1 where said ultrathin iron film has a vertical easy axis of magnetization.

4. The medium of claim 1 where cycling the medium over a range of temperature to include exceeding a transition temperature does not change the magnetic hysteresis properties of the medium.

5. The medium of claim 1 where the shape of a hysteresis loop associated with said medium is approximately rectangular and experiences no significant change subsequent to a thermal cycling through said medium's transition temperature.

6. The method of claim 2 in which the temperature of said substrate during said high vacuum, molecular beam epitaxy deposition technique can have values in a range from approximately 100 K to less than 270 K.

7. The method of claim 2 where said high vacuum, molecular beam epitaxial deposition occurs with said substrate at a temperature of about 100 K.

8. The medium of claim 1 where the orientation of a palladium substrate crystal is such that said palladium substrate has miller indices of (100).

9. The medium of claim 1 where said medium is thermally stable with respect to the vertical or perpendicular orientation of the magnetization vector for the ultrathin iron film.

10. The medium of claim 1 in which said medium is magnetically stable with respect to the vertical or perpendicular orientation of the magnetization vector for the ultrathin iron film.

* * * * *